US011910546B2

United States Patent
Hano

(10) Patent No.: US 11,910,546 B2
(45) Date of Patent: Feb. 20, 2024

(54) EXPLOSION-PROOF STRUCTURE FOR ELECTRONIC COMPONENT

(71) Applicant: TOSHIBA MITSUBISHI-ELECTRIC INDUSTRIAL SYSTEMS CORPORATION, Chuo-ku (JP)

(72) Inventor: Mitsuru Hano, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 187 days.

(21) Appl. No.: 17/285,758

(22) PCT Filed: Jun. 3, 2019

(86) PCT No.: PCT/JP2019/022002
§ 371 (c)(1),
(2) Date: Apr. 15, 2021

(87) PCT Pub. No.: WO2020/245879
PCT Pub. Date: Dec. 10, 2020

(65) Prior Publication Data
US 2022/0141974 A1    May 5, 2022

(51) Int. Cl.
*H05K 5/02* (2006.01)

(52) U.S. Cl.
CPC .................. *H05K 5/0213* (2013.01)

(58) Field of Classification Search
None
See application file for complete search history.

(56) References Cited

U.S. PATENT DOCUMENTS

| 984,358 A | * | 2/1911 | Dawson | F02B 75/265 |
| | | | | 123/73 V |
| 1,810,697 A | * | 6/1931 | Dibble | F23M 11/00 |
| | | | | 110/173 B |

(Continued)

FOREIGN PATENT DOCUMENTS

| CN | 2171813 Y | * | 7/1994 |
| CN | 201010189 Y | * | 1/2008 |

(Continued)

OTHER PUBLICATIONS

Combined Chinese Office Action and Search Report dated May 12, 2022 in Chinese Patent Application No. 201980004786.5 (with unedited computer generated English translation), 19 pages.

(Continued)

*Primary Examiner* — Timothy J. Dole
*Assistant Examiner* — Muhammed Azam
(74) *Attorney, Agent, or Firm* — Oblon, McClelland, Maier & Neustadt, L.L.P.

(57) ABSTRACT

An explosion-proof structure having a housing that houses an electronic device, a cover member that covers a first ventilation port formed on one surface of the housing at least in a normal direction to the one surface, an opening/closing member that opens and closes a second ventilation port formed between the one surface and the cover member, and a rotation support portion provided at a peripheral portion of the first ventilation port and that supports the opening/closing member, the opening/closing member rotating around the rotation support portion, using the rotation support portion as a center of rotation.

9 Claims, 6 Drawing Sheets

(56) References Cited

U.S. PATENT DOCUMENTS

| | | | | |
|---|---|---|---|---|
| 3,987,785 | A | * 10/1976 | Long | F23L 11/005 |
| | | | | 110/163 |
| 7,083,660 | B2 | * 8/2006 | Hara | B29C 66/534 |
| | | | | 55/527 |
| 2007/0163648 | A1 | * 7/2007 | Eijkelenberg | F16K 17/36 |
| | | | | 137/71 |
| 2018/0135688 | A1 | * 5/2018 | Kang | F16B 47/00 |

FOREIGN PATENT DOCUMENTS

| | | | | | |
|---|---|---|---|---|---|
| CN | 201412181 | Y | * | 2/2010 | |
| CN | 103346485 | A | | 10/2013 | |
| CN | 104377574 | A | * | 2/2015 | H02B 1/24 |
| CN | 105207069 | A | | 12/2015 | |
| CN | 106025903 | A | * | 10/2016 | H02B 13/025 |
| CN | 205810926 | U | | 12/2016 | |
| CN | 106340815 | A | * | 1/2017 | |
| CN | 205892194 | U | | 1/2017 | |
| CN | 107069458 | A | * | 8/2017 | |
| CN | 107086450 | A | | 8/2017 | |
| CN | 107742835 | A | * | 2/2018 | H02B 1/28 |
| CN | 108039661 | A | * | 5/2018 | H02B 1/28 |
| CN | 108039672 | A | | 5/2018 | |
| CN | 108321704 | A | * | 7/2018 | H02B 1/28 |
| CN | 106786007 | B | * | 2/2019 | |
| CN | 109640552 | A | * | 4/2019 | H05K 5/0213 |
| CN | 110461120 | A | * | 11/2019 | H05K 5/0213 |
| CN | 110566923 | A | * | 12/2019 | |
| CN | 110812736 | A | * | 2/2020 | |
| CN | 111316764 | A | * | 6/2020 | F21S 45/30 |
| DE | 10142103 | A1 | * | 6/2002 | E04H 1/1238 |
| EP | 3070219 | A1 | * | 9/2016 | A62C 3/00 |
| FR | 2749734 | A1 | * | 12/1997 | H02B 1/28 |
| JP | 58-145001 | U | | 9/1983 | |
| JP | 2012-253980 | A | | 12/2012 | |
| JP | 5452787 | B1 | * | 3/2014 | H02B 1/28 |
| JP | 2016-111915 | A | | 6/2016 | |
| JP | 2017-108563 | A | | 6/2017 | |
| JP | 2017-133802 | A | | 8/2017 | |
| KR | 20090037144 | A | * | 4/2009 | |
| KR | 101784066 | B1 | * | 9/2017 | |
| WO | WO 2019/053955 | A1 | | 3/2019 | |
| WO | WO-2020245879 | A1 | * | 12/2020 | H05K 5/0213 |
| WO | WO-2022059065 | A1 | * | 3/2022 | H05K 5/0214 |

OTHER PUBLICATIONS

Combined Chinese Office Action and Search Report dated Oct. 14, 2022, in corresponding Chinese Patent Application No. 201980004786.5 (with English Translation), 15 pages.

International Search Report dated Sep. 3, 2019 in PCT/JP2019/022002 filed Jun. 3, 2019, 2 pages.

Indian Office Action dated Feb. 18, 2021 in India Patent Application No. 202017026607 filed Jun. 23, 2020, 5 pages.

* cited by examiner

EXPLOSION-PROOF STRUCTURE FOR ELECTRONIC COMPONENT

TECHNICAL FIELD

The present invention relates to an explosion-proof structure.

BACKGROUND ART

Conventionally, there has been disclosed a filter mounting structure that covers an opening formed in a door of a storage panel that stores a power conversion device (for example, see Patent Document 1).

Also, conventionally, there has been disclosed a device in which openings are formed on each of two surfaces whose normal directions are orthogonal to each other among surfaces of a housing (for example, see Patent Document 2 or Patent Document 3).

PRIOR ART DOCUMENTS

Patent Document

[Patent Document 1]
Japanese Unexamined Patent Application, First Publication No. 2016-111915
[Patent Document 2]
Japanese Unexamined Patent Application, First Publication No. 2017-108563
[Patent Document 3]
Japanese Unexamined Patent Application, First Publication No. 2017-133802

SUMMARY OF INVENTION

Problems to be Solved by the Invention

By the way, in a housing that houses electronic components as in each device according to the above-described related art, it is desired to suppress a high-pressure gas or internal components spouting or scattering to the outside from a ventilation port of the housing due to a rise in internal pressure caused by arc discharge or the like inside the housing.

The present invention has been made in view of the above circumstances, and an object of the present invention is to provide an explosion-proof structure of an electronic device capable of suppressing ejection of gas to the outside or scattering of components due to an increase in internal pressure.

Means for Solving the Problems

The explosion-proof structure of the electronic device according to the embodiment includes a housing, a cover member, and an opening/closing member. The housing houses electronic components. The cover member covers a first ventilation port formed on one surface of the housing at least in a normal direction to the one surface. The opening/closing member opens and closes a second ventilation port formed between one surface and the cover member.

DESCRIPTION OF EMBODIMENTS

Hereinafter, an explosion-proof structure of an embodiment will be described with reference to the accompanying drawings.

Figure 1:
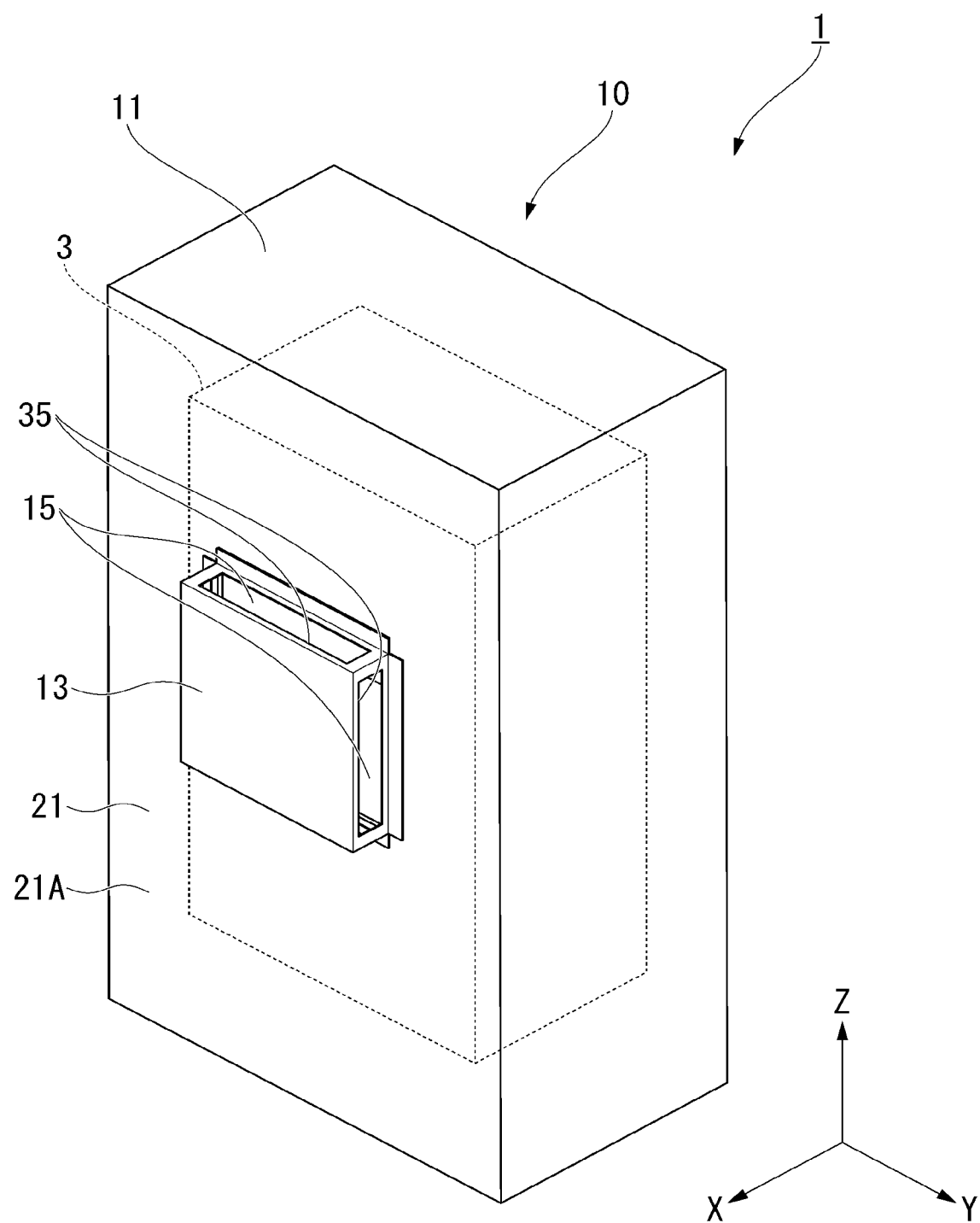
FIG. 1 is a perspective view of an explosion-proof structure according to an embodiment.
Figure 2:
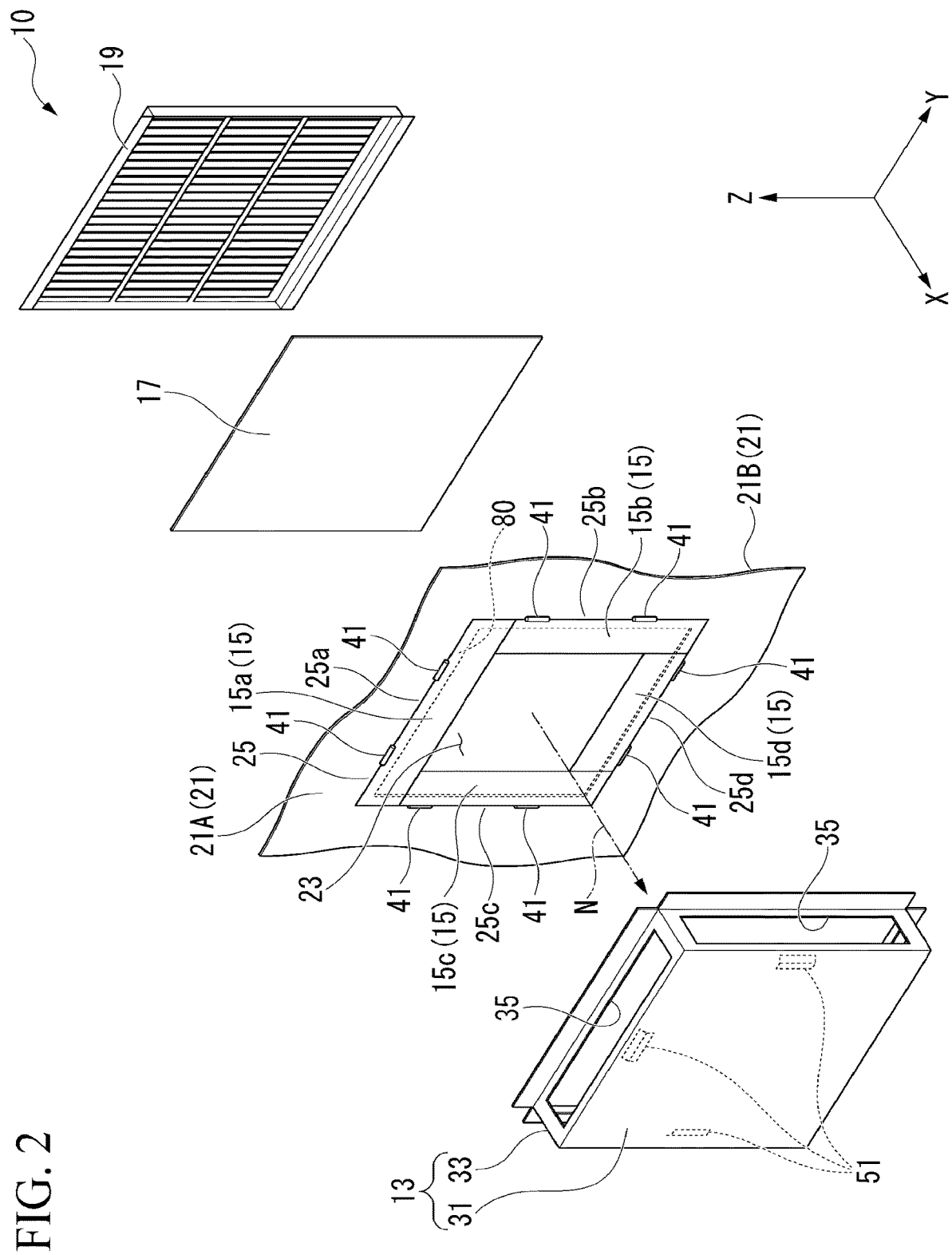
FIG. 2 is an exploded perspective view of the explosion-proof structure according to the embodiment.

FIG. 1 is a perspective view of an explosion-proof structure 10 according to the embodiment. FIG. 2 is an exploded perspective view of the explosion-proof structure 10 according to the embodiment.

In the following, the X-axis, Y-axis, and Z-axis directions orthogonal to each other in a three-dimensional space are directions parallel to the respective axes. For example, the front-back direction of the electronic device including the explosion-proof structure 10 is parallel to the X-axis direction. The positive direction in the X-axis direction is a direction from the rear to the front of the electronic device. The left-right direction of the electronic device is parallel to the Y-axis direction. The positive direction in the Y-axis direction is a direction from the right side to the left side of the electronic device. The up-and-down direction and the vertical direction of the electronic device are parallel to the Z-axis direction. The positive direction in the Z-axis direction is a direction from the downward portion to the upper portion of the electronic device.

As shown in FIG. 1 and FIG. 2, the explosion-proof structure 10 according to the embodiment is provided on various panels 1 provided in electronic facilities and the like. The panel 1 is, for example, a power distribution panel, a power distribution panel, a control panel, and the like that constitute a power conversion device, a power supply device, a motor drive device, and the like.

The explosion-proof structure 10 includes a housing 11 that houses the electronic device 3, a cover member 13 that covers a first ventilation port 23 formed in a front portion 21 of the housing 11, a plurality of opening/closing members 15 provided on a peripheral portion 25 of the first ventilation port 23, a filter 17 and a fixed panel 19 that closes the first ventilation port 23.

The housing 11 houses various electronic devices 3 therein. The various electronic devices 3 include, for example, a transformer, a switch, a circuit breaker, a measuring device, a control device, and the like.

The first ventilation port 23 formed in the front portion 21 of the housing 11 is penetrated so as to face the electronic device 3 in the X-axis direction, for example. The first ventilation port 23 is, for example, a rectangular opening when viewed from the X-axis direction.

The outer shape of the cover member 13 is formed, for example, in a rectangular box shape. The cover member 13 is fixed to the front portion 21 outside the housing 11. The cover member 13 covers the first ventilation port 23 from outside the housing 11. The cover member 13 includes, for example, a shielding portion 31 and a support portion 33 bent and extended from the periphery of the shielding portion 31.

The outer shape of the shielding portion 31 is formed, for example, in a rectangular plate shape corresponding to the shape of the first ventilation port 23. The size of the shielding portion 31 is formed, for example, larger than the opening area of the first ventilation port 23.

The shielding portion 31 covers the first ventilation port 23 at least in the normal direction N of the surface 21A of the front portion 21. The normal direction N is, for example, the positive direction of the X-axis direction. The shielding portion 31 is arranged at a position at a predetermined distance from the surface 21A of the front portion 21 in the normal direction N. At least a part of the shielding portion 31 overlaps the entire area of the first ventilation port 23 when viewed from the normal direction N.

The outer shape of the support portion 33 is formed, for example, in a rectangular cylindrical shape so as to correspond to the shape of the shielding portion 31. The support portion 33 is formed integrally with the shielding portion 31. The support portion 33 is fixed to the peripheral portion 25 of the first ventilation port 23 on the surface 21A of the front portion 21.

In the support portion 33, a plurality of second ventilation ports 35 penetrating in a direction orthogonal to the normal direction N of the surface 21A is formed. The plurality of second ventilation ports 35 are, for example, two (i.e., a total of four) second ventilation ports 35 penetrating the support portion 33 in each of the Y-axis direction and the Z-axis direction. For example, the opening area of the plurality of second ventilation ports 35 as a whole and the opening area of the first ventilation ports 23 are the same within a predetermined range.

The outer shape of each of the plurality of opening/closing members 15 provided on the peripheral portion 25 of the first ventilation port 23 is formed, for example, in a rectangular plate shape. The size of each opening/closing member 15 is formed, for example, larger than the opening area of each second ventilation port 35. The plurality of opening/closing members 15 are, for example, four opening/closing members 15 corresponding to the four second ventilation ports 35. The four opening/closing members 15 are, for example, a first opening/closing member 15a, a second opening/closing member 15b, a third opening/closing member 15c, and a fourth opening/closing member 15d.

The first opening/closing member 15a is connected to a vertically upper portion 25a of the peripheral portion 25 on the positive side in the Z-axis direction. The second opening/closing member 15b is connected to the left portion 25b of the peripheral portion 25 on the positive side in the Y-axis direction. The third opening/closing member 15c is connected to the right portion 25c of the peripheral portion 25 on the negative side in the Y-axis direction. The fourth opening/closing member 15d is connected to the vertically downward portion 25d of the peripheral portion 25 on the negative side in the Z-axis direction.

Each opening/closing member 15 includes two rotation support portions 41 connected to the peripheral portion 25 of the first ventilation port 23 on the surface 21A of the front portion 21. Each opening/closing member 15 is supported by the front portion 21 of the housing 11 via these two rotation support portions 41.

For example, with respect to each of the first opening/closing member 15a and the fourth opening/closing member 15d disposed on the positive side and the negative side in the Z-axis direction, each of the two rotation support portions 41 is arranged at a predetermined interval in the Y-axis direction. For example, with respect to each of the second opening/closing member 15b and the third opening/closing member 15c arranged on the positive side and the negative side in the Y-axis direction, each of the two rotation support portions 41 is arranged at a predetermined interval in the Z-axis direction.

Each of the opening/closing members 15 rotates around each of the two rotation support portions 41 with each of the two rotation support portions 41 as a center of rotation. Each rotation support portion 41 is, for example, a hinge connecting each opening/closing member 15 and the peripheral portion 25. Each opening/closing member 15 opens and closes each second ventilation port 35 by rotation around each two rotation support portions 41.

Since each of the two rotation supporting portions 41 is connected to the surface 21A of the front portion 21, each of the opening/closing members 15 in a state where each of the second ventilation ports 35 is opened comes into contact with the peripheral portion 25 when rotating around each of the two rotation supporting portions 41. Thereby, entry into the inside of the housing 11 from the first ventilation port 23 is prohibited. That is, the innermost peripheral portion 80 in the peripheral portion 25 of the first ventilation port 23 that overlaps with each of the opening/closing members 15 in the X direction has a role as an entry restricting member that restricts each of the opening/closing members 15 from entering the inside of the housing 11.

For example, when air or the like flows from the outside to the inside of the housing 11 through each of the second ventilation ports 35 and the first ventilation ports 23, the opening/closing members 15 do not enter the inside of the housing 11 but contacts the innermost peripheral portion 80 of the peripheral portion 25 so as to close a part of the first ventilation port 23.

FIGS. 3A to 3D are a perspective view of the explosion-proof structure 10 according to the embodiment, each showing changes in the state. FIGS. 4A and 4B are cross-sectional views of the explosion-proof structure 10 according to the embodiment, each showing changes in the state.

Figure 3A:
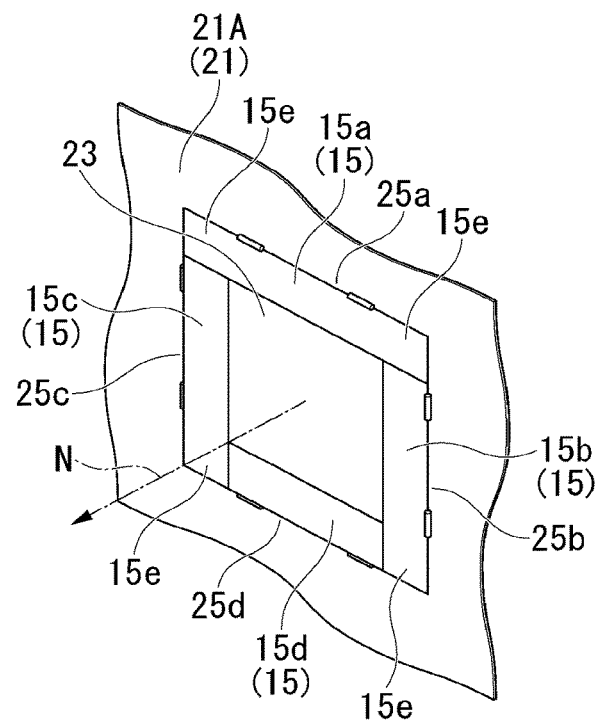
FIGS. 3A to 3D are perspective views of the explosion-proof structure according to the embodiment, each showing changes in the state.
Figure 4A:
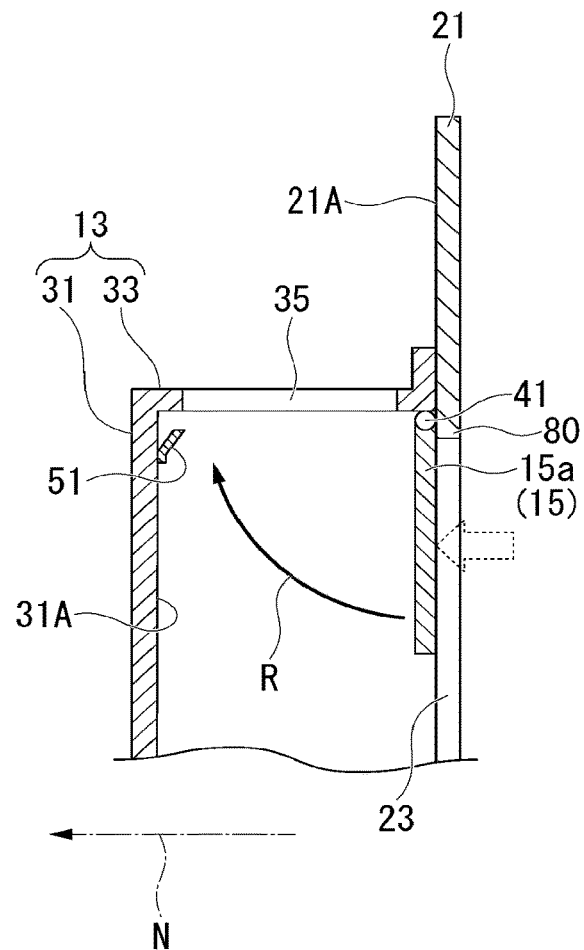
FIGS. 4A and 4B are cross-sectional views of the explosion-proof structure according to the embodiment, each showing changes in the state.
Figure 4B:
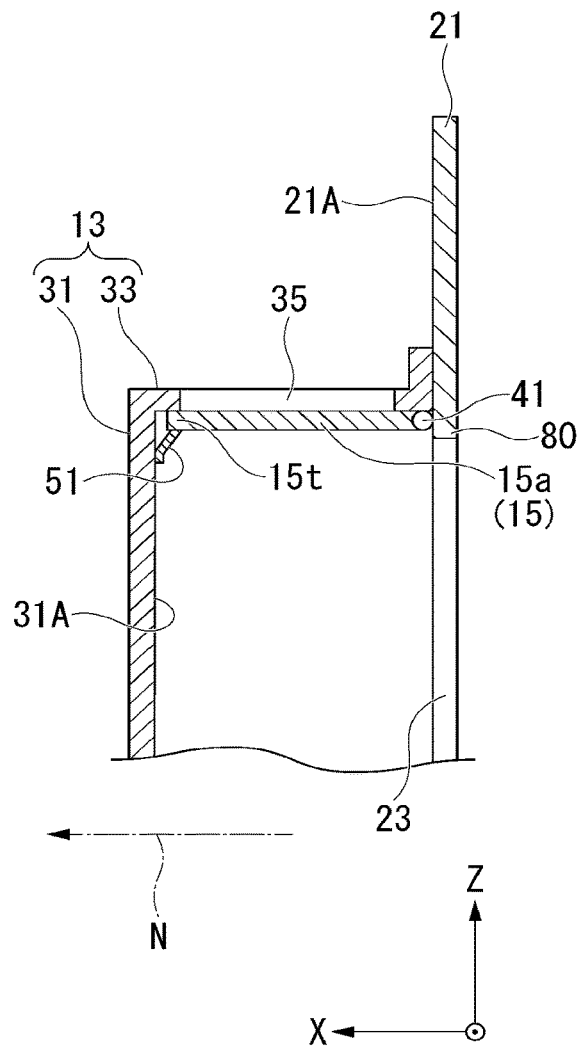

As shown in FIG. 3A, in the open state of the four second ventilation ports 35 (referred to as a first state (a)), the four opening/closing members 15 close a part of the first ventilation port 23 while overlapping their ends in the normal direction N. The first opening/closing member 15a of the four opening/closing members 15 is disposed outermost with respect to the housing 11 in the normal direction N. The second opening/closing member 15b and the third opening/closing member 15c overlap with the end portion 15e of the first opening/closing member 15a on the surface 21A side of the first opening/closing member 15a in the normal direction N. The fourth opening/closing member 15d overlaps with each end portion 15e portion of the second opening/closing member 15b and the third opening/closing member 15c on the surface 21A side of the second opening/closing member 15b and the third opening/closing member 15c in the normal direction N.

The first opening/closing member 15a of the four opening/closing members 15 maintains the open state of the second ventilation port 35 and the closed state of a part of the first ventilation port 23 due to gravity (self-weight) acting on the first opening/closing member 15a. The second opening/closing member 15b, the third opening/closing member 15c, and the fourth opening/closing member 15d of the four opening/closing members 15 maintains the open state of each of the second ventilation ports 35 and the closed state of a part of the first ventilation ports 23 by the pressing force applied from the first opening/closing member 15a toward the front portion 21 of the housing 11 in the negative direction of the X-axis due to gravity (self-weight) acting on the first opening/closing member 15a.

Figure 3B:
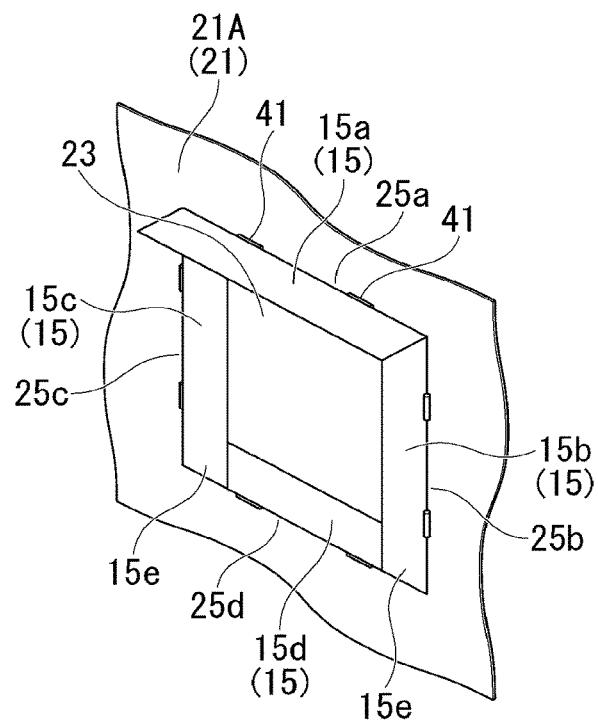
Figure 3C:
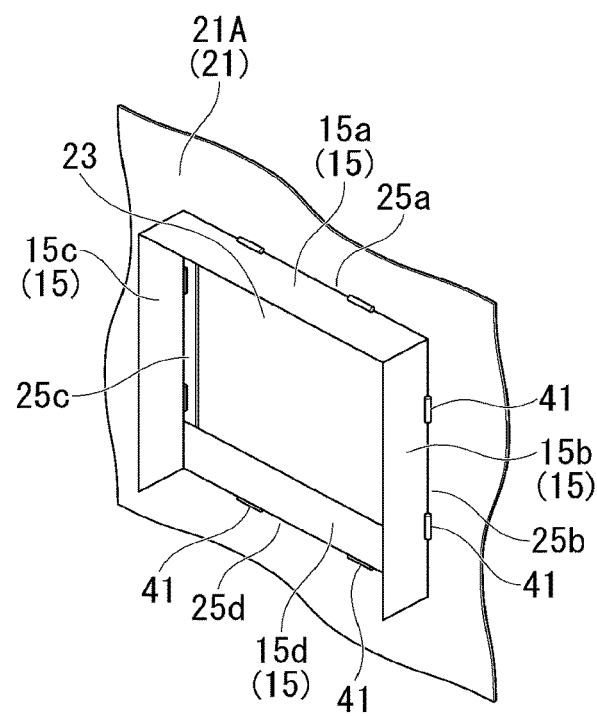
Figure 3D:
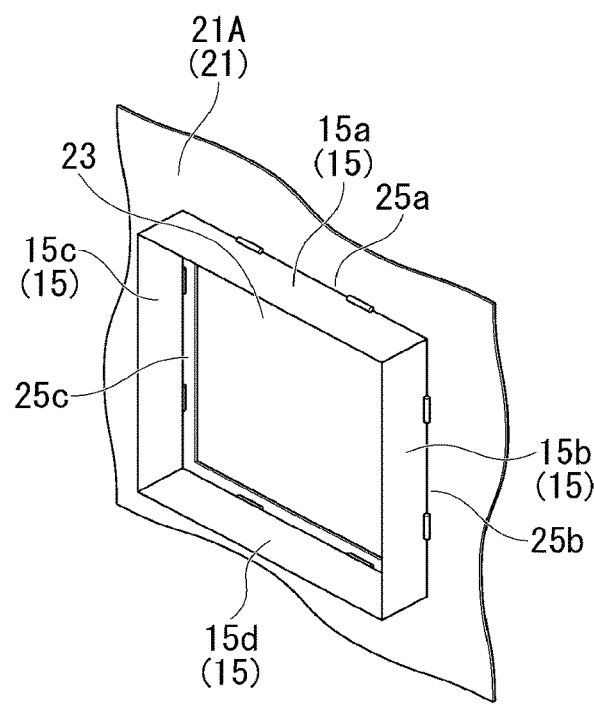

For example, when gas or the like flows from the inside of the housing 11 to the outside through the first ventilation port 23 due to an increase in the internal pressure of the housing 11, the state of the explosion-proof structure 10 sequentially transitions from the first state (a) shown in FIG. 3A to the second state (b) shown in FIG. 3B, the third state (c) shown in FIG. 3C, and the fourth state (d) shown in FIG. 3D.

First, in the second state (b) of FIG. 3B, the first opening/closing member 15a disposed on the outermost side with respect to the housing 11 in the normal direction N rotates around the two rotation support portions 41. The first opening/closing member 15a closes the second ventilation port 35 formed on the positive side in the Z-axis direction of the support portion 33.

Next, in the third state (c), each of the second opening/closing member 15b and the third opening/closing member 15c that are arranged outside the fourth opening/closing member 15d in the normal direction N rotates around each of the two rotation support portions 41, respectively. The second opening/closing member 15b and the third opening/closing member 15c close the two second ventilation ports 35 formed on the positive side and the negative side in the Y-axis direction of the support portion 33.

Next, in the fourth state (d), the fourth opening/closing member 15d disposed closest to the surface 21A in the normal direction N rotates around the two rotation support portions 41. The fourth opening/closing member 15d closes the second ventilation port 35 formed on the negative side of the support portion 33 in the Z-axis direction.

As shown in FIGS. 2, 4A and 4B, the cover member 13 includes a plurality of rotation restricting members 51 that restrict the rotation of each opening/closing member 15 in a state where each second ventilation port 35 is closed. The plurality of rotation restricting members 51 are, for example, three rotation restricting members 51 provided for the first opening/closing member 15a, the second opening/closing member 15b, and the third opening/closing member 15c. Each rotation restricting member 51 is provided on the inner surface 31A of the shielding portion 31 facing the surface 21A of the front portion 21 in the normal direction N, for example.

The outer shape of each rotation restricting member 51 is formed in, for example, a claw shape protruding from the inner surface 31A. Each rotation restricting member 51 is formed of, for example, an elastic material. In a case in which the state is shifted from the open state of each second ventilation port 35 shown in the first state (a) of FIG. 4A to the closed state of each second ventilation port 35 shown in the second state (b) of FIG. 4B, each opening/closing member 15 rotates toward each second ventilation port 35. For example, when each opening/closing member 15 rotates toward each second ventilation port 35, each rotation restricting member 51 enters the rear side from the front side in the rotation direction R by being elastically deformed by contacting the distal end portion 15t of each opening/closing member 15. Each rotation restricting member 51 restricts the rotation of each opening/closing member 15 away from each second ventilation port 35 by abutting against the distal end portion 15t of each opening/closing member 15 from the rear side in the rotation direction R.

The filter 17 and the fixed panel 19 for closing the first ventilation port 23 of the housing 11 are arranged inside the housing 11. The filter 17 covers the first ventilation port 23 from the inside of the housing 11. The fixed panel 19 is fixed to the back surface 21B of the front portion 21 of the housing 11 and supports the filter 17. The filter 17 allows air and the like to pass through the first ventilation port 23 and prohibits the passage of foreign matter such as dust.

As described above, the explosion-proof structure 10 according to the embodiment includes the cover member 13 that covers the first ventilation port 23 of the housing 11 in the normal direction N of the surface 21A. Therefore, it is possible to suppress the gas or the like caused by the internal arc from being ejected from the inside of the housing 11 to the front side of the first ventilation port 23.

The explosion-proof structure 10 includes an opening/closing member 15 that opens and closes the second ventilation port 35 formed in the cover member 13. Thereby, at the time of opening, air and the like can flow between the inside and the outside of the housing 11. At the time of closing, it is possible to suppress the gas or the like caused by the internal arc from being ejected to the outside.

The explosion-proof structure 10 includes a rotation support portion 41 that supports the opening/closing member 15. Thereby, the second ventilation port 35 of the cover member 13 can be automatically closed by the opening/closing member 15 that rotates due to an increase in internal pressure caused by the internal arc.

The rotation support portion 41 is connected to the surface 21A of the front portion 21. Thereby, the opening/closing member 15 in a state where the second ventilation port 35 is opened contacts the peripheral portion 25 even when rotated, so that entry or fall into the inside of the housing 11 from the first ventilation port 23 is restricted.

The explosion-proof structure 10 includes a rotation restricting member 51 that restricts rotation of the opening/closing member 15 in a state where the second ventilation port 35 is closed. Thereby, it is possible to prevent that the second ventilation port 35 of the cover member 13 is opened by the rebound of the opening/closing member 15, or the like.

The four opening/closing members 15 cover a part of the first ventilation port 23 while overlapping their ends in the normal direction N. Thereby, due to the gravity (self-weight) acting on the first opening/closing member 15a disposed on the outermost side with respect to the housing 11 in the normal direction N, the open state of each second ventilation port 35 and the closed state of a part of the first ventilation port 23 can be easily maintained.

The opening area of the plurality of second ventilation ports 35 as a whole and the opening area of the first ventilation ports 23 are the same within a predetermined range. Therefore, a desired amount of air or the like flowing between the inside and the outside of the housing 11 can be secured.

Hereinafter, a modification of the embodiment will be described.

In the above-described embodiment, the rotation restricting member 51 abuts on the distal end portion 15t of the opening/closing member 15 from the rear side (the side opposite to the second ventilation port 35) in the rotation direction R, but it is not limited thereto. For example, the rotation restricting member 51 may be mechanically joined to the distal end portion 15t of the opening/closing member 15 by elastic engagement with a so-called cantilever type snap fit.

In the above-described embodiment, the four opening/closing members 15 maintain the closed state of a part of the first ventilation port 23 by the gravity acting on the first opening/closing member 15a, but it is not limited thereto. For example, the explosion-proof structure 10 may include an elastic member that generates a force for pushing or pulling each of the opening/closing members 15 toward each of the first ventilation ports 23 by elasticity, or a magnet or the like that generates a magnetic force that overlaps the mutual ends of the four opening/closing members 15.

In the above-described embodiment, the three rotation restricting members 51 are provided for the first opening/closing member 15a, the second opening/closing member 15b, and the third opening/closing member 15c, but they are not limited thereto. The cover member 13 may further include a rotation restricting member 51 provided for the fourth opening/closing member 15d.

In the above-described embodiment, the opening area of a vertically upper second ventilation port 35 among the plurality of second ventilation ports 35 formed in the support portion 33 of the cover member 13 may be smaller than or equal to the opening area of the other second ventilation port 35. The other second ventilation port 35 may be at least a vertically downward second ventilation port 35.

In addition, the explosion-proof structure 10 may include a louver member 61 provided at least at a vertically upper second ventilation port 35 among the plurality of second ventilation ports 35 formed in the support portion 33 of the cover member 13.

Figure 5:
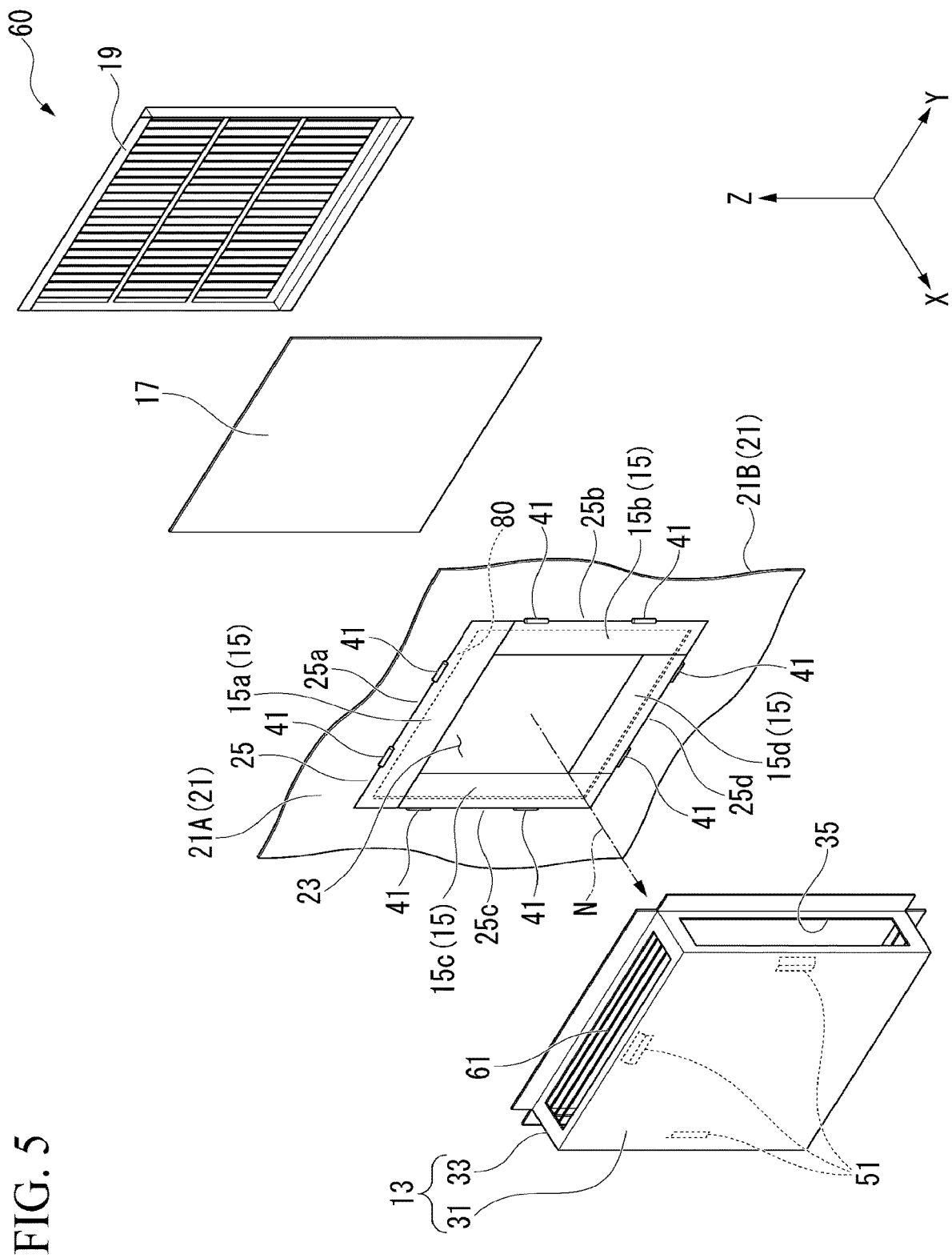
FIG. 5 is an exploded perspective view of an explosion-proof structure according to a first modification of the embodiment.

FIG. 5 is an exploded perspective view of an explosion-proof structure 60 according to a first modification of the embodiment.

As shown in FIG. 5, the explosion-proof structure 60 according to the first modification includes a louver member 61 disposed at a vertically upper second ventilation port 35 among the plurality of second ventilation ports 35 formed in the support portion 33 of the cover member 13. The louver member 61 reduces the opening area of the vertically upper second ventilation port 35 to be smaller than the opening area of the other second ventilation ports 35, and suppresses the invasion of foreign matters into the second ventilation port 35 from the upper side to the downward side in the vertical direction.

In the first modification, the opening area of the vertically upper second ventilation port 35 is smaller than the opening area of the other second ventilation ports 35. Thereby, it is possible to prevent foreign matters such as water, which flows from the upper side to the downward side in the vertical direction, from entering the inside of the cover member 13.

In the above-described embodiment, each opening/closing member 15 opens and closes each second ventilation port 35 by rotation around each two rotation support portions 41, but it is not limited thereto. Each opening/closing member 15 may irreversibly close the second ventilation port 35 by being plastically deformed by a predetermined pressure inside the housing 11 without the rotation support portion 41.

Figure 6:
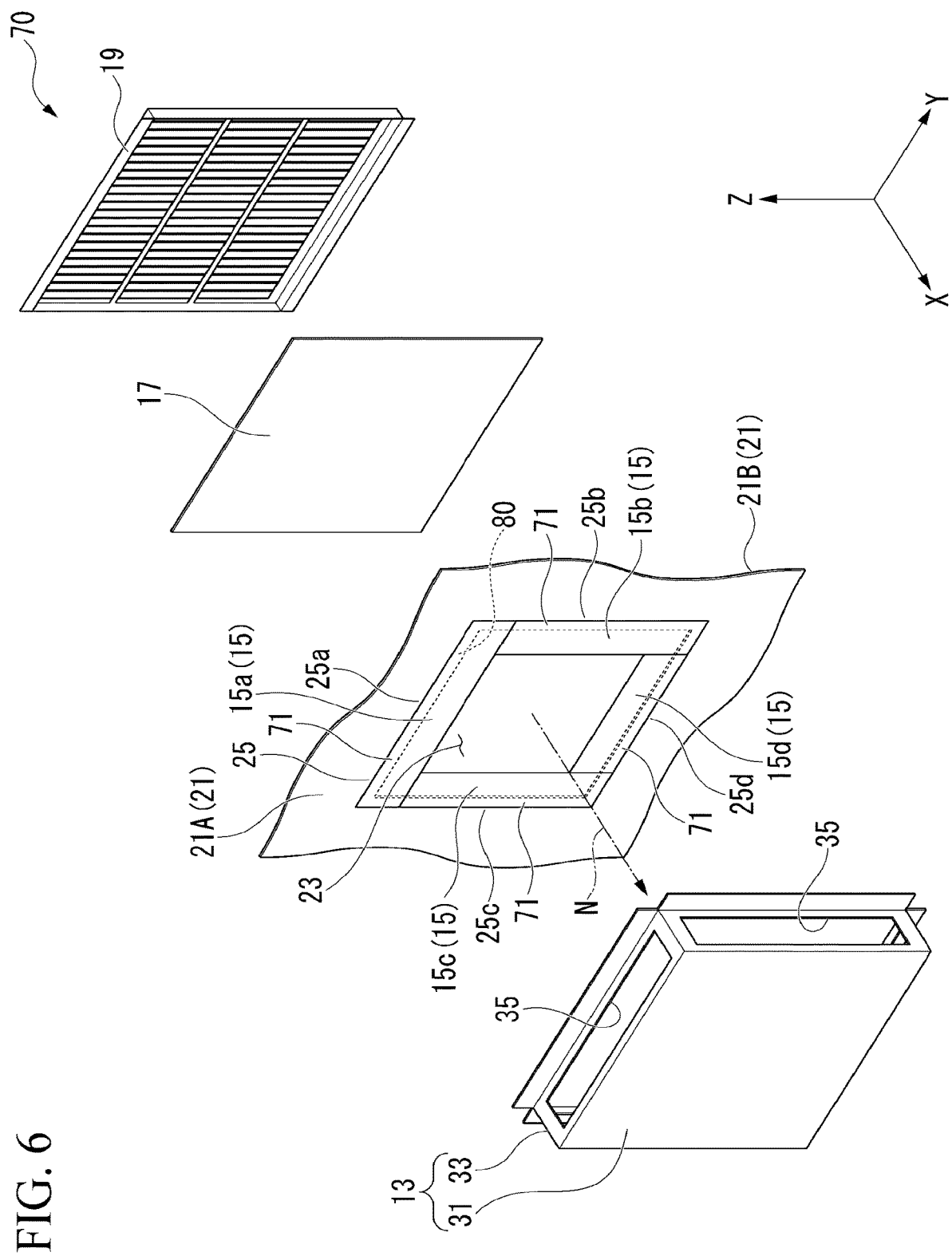
FIG. 6 is an exploded perspective view of an explosion-proof structure according to a second modification of the embodiment.

FIG. 6 is an exploded perspective view of an explosion-proof structure 70 according to a second modification of the embodiment. Each of the plurality of opening/closing members 15 in the explosion-proof structure 70 of the second modification is fixed to the peripheral portion 25 of the first ventilation port 23. Each opening/closing member 15 includes each plastic deformation portion 71 around the peripheral edge 25. Each plastic deformation portion 71 plastically deforms each opening/closing member 15 so as to bend toward each second ventilation port 35 by a predetermined pressure inside the housing 11. For example, a concave groove or a plurality of through holes extending along a virtual fold may be formed in each plastic deformation portion 71.

In the second modification, the plurality of rotation restricting members 51 of the above-described embodiment may be omitted.

Further, in the second modification, each opening/closing member 15 is provided with each plastically deformed portion 71 around the peripheral portion 25, but it is not limited thereto. The entirety of each opening/closing member 15 may be the plastic deformation portion 71.

Although several embodiments of the present invention have been described, these embodiments are provided by way of example and are not intended to limit the scope of the invention. These embodiments can be implemented in other various forms, and various omissions, replacements, and changes can be made without departing from the spirit of the invention. These embodiments and their modifications are included in the scope and gist of the invention, and are also included in the invention described in the claims and equivalents thereof.

REFERENCE SIGNS LIST

1: Board, 3: Electronic device, 10: Explosion-proof structure, 11: Housing, 13: Cover member, 15: Opening/closing member, 17: Filter, 19: Fixed panel, 21: Front portion, 21A: Surface, 23: First ventilation port, 25: Peripheral portion, 31: Shielding portion, 33: Support portion, 35: Second ventilation port, 41: Rotation support portion, 51: Rotation restriction member, 80: Innermost peripheral portion (Entrance restriction member), N: Normal direction, R: Rotation direction

The invention claimed is:

1. An explosion-proof structure comprising:
a housing configured to house an electronic device;
a cover member configured to cover a first ventilation port formed on one surface of the housing at least in a normal direction to the one surface;
an opening/closing member configured to open and close a second ventilation port formed between the one surface and the cover member; and
a rotation support portion provided at a peripheral portion of the first ventilation port and configured to support the opening/closing member,
wherein the opening/closing member is configured to rotate around the rotation support portion, using the rotation support portion as a center of rotation.

2. The explosion-proof structure according to claim 1, comprising a rotation restricting member configured to restrict rotation of the opening/closing member in a state where the second ventilation port is closed.

3. The explosion-proof structure according to claim 1, comprising an entry restricting member configured to restrict entry into the housing by rotation of the opening/closing member in a state where the second ventilation port is opened.

4. The explosion-proof structure according to claim 1, comprising, a plurality of opening/closing members, each of the plurality of opening/closing members being identical to the opening/closing member,
wherein the plurality of opening/closing members comprises:
a first opening/closing member connected to an upper portion in a vertical direction of the peripheral portion; and at least one second opening/closing member connected to a portion other than the upper portion in the vertical direction of the peripheral portion, wherein, in a state where the second ventilation port is opened, at least a part of the second opening/closing member overlaps the first opening/closing member on one surface side of the first opening/closing member in the normal direction.

5. The explosion-proof structure according to claim 4, wherein the plurality of opening/closing members comprises:
a third opening/closing member connected to a downward portion in the vertical direction of the peripheral portion, wherein, in a state where the second ventilation port is opened, at least a part of the third opening/closing member overlaps the second opening/closing member on one surface side of the second opening/closing member in the normal direction.

6. The explosion-proof structure according to claim 1, wherein
the opening/closing member include a plastic deformation portion plastically deformed by a predetermined pressure inside the housing, and
the second ventilation port is closed by plastic deformation of the plastic deformation portion.

7. The explosion-proof structure according to claim 1, wherein an opening area of the first ventilation port and an opening area of the second ventilation port are same and within a predetermined range.

8. The explosion-proof structure according to claim 7, wherein an opening area in a vertically upper portion of the second ventilation port is smaller than at least an opening area in a vertically downward portion of the second ventilation port.

9. An explosion-proof structure according to claim 8, comprising an upper cover member configured to cover at least a part of an opening in the vertically upper portion of the second ventilation port.

* * * * *